United States Patent
Du et al.

(10) Patent No.: US 11,073,565 B2
(45) Date of Patent: Jul. 27, 2021

(54) CALCULATING A REMAINING CAPACITY OF A BATTERY

(71) Applicant: O2Micro, Inc., Santa Clara, CA (US)

(72) Inventors: Sterling Du, Shanghai (CN); Yong Song, Shenzhen (CN); Yi Yuan, Wuhan (CN); Ruobing Ren, Shenzhen (CN)

(73) Assignee: O2Micro, Inc., Santa Clara, CA (US)

(*) Notice: Subject to any disclaimer, the term of this patent is extended or adjusted under 35 U.S.C. 154(b) by 221 days.

(21) Appl. No.: 16/280,828

(22) Filed: Feb. 20, 2019

(65) Prior Publication Data

US 2020/0174081 A1 Jun. 4, 2020

(30) Foreign Application Priority Data

Nov. 30, 2018 (CN) .......................... 201811454540.1

(51) Int. Cl.
*G01R 31/3842* (2019.01)
*G01R 31/36* (2020.01)

(52) U.S. Cl.
CPC ..... *G01R 31/3842* (2019.01); *G01R 31/3648* (2013.01)

(58) Field of Classification Search
CPC .................................................. G01R 31/3842
USPC ......................................................... 702/63
See application file for complete search history.

(56) References Cited

U.S. PATENT DOCUMENTS

| | | | | |
|---|---|---|---|---|
| 5,955,869 A * | 9/1999 | Rathmann | ............. | H01M 10/42 320/132 |
| 6,621,250 B1 * | 9/2003 | Ohkubo | ............. | G01R 31/3842 320/136 |
| 10,594,145 B1 * | 3/2020 | Wang | ..................... | H02J 7/0048 |
| 2013/0275067 A1 * | 10/2013 | Mikuteit | ............ | G01R 31/3648 702/63 |
| 2014/0285156 A1 * | 9/2014 | Mukaitani | ............ | G01R 31/392 320/134 |
| 2014/0295261 A1 * | 10/2014 | Miyake | ............. | H01M 10/0566 429/199 |
| 2015/0318582 A1 * | 11/2015 | Brockman | .......... | H01M 10/637 320/137 |
| 2016/0377686 A1 * | 12/2016 | Uchida | ............. | G01R 31/3842 702/63 |

* cited by examiner

*Primary Examiner* — Ricky Go

(57) ABSTRACT

A method for calculating a remaining capacity of a battery includes: recording a sleep time of a battery monitor in sleep mode; reading an open circuit voltage measured and stored in sleep mode when the sleep time is greater than a preset time period and determining a first remaining capacity ratio based on the open circuit voltage; calculating charges consumed based on a preset current and the sleep time; calculating a second remaining capacity ratio based on charges consumed, a stored first remaining capacity value and a preset total capacity; reading values of battery parameters; determining a third remaining capacity ratio based on the values of battery parameters; and determining a current remaining capacity ratio based on the first remaining capacity ratio, the second remaining capacity ratio and the third remaining capacity ratio.

12 Claims, 4 Drawing Sheets

CALCULATING A REMAINING CAPACITY OF A BATTERY

RELATED APPLICATION

This application claims priority to Chinese Patent Application No. 201811454540.1, titled "Method and Apparatus for Calculating a Remaining Capacity of a Battery," filed on Nov. 30, 2018, with the National Intellectual Property Administration of the People's Republic of China (CNIPA).

BACKGROUND

Batteries are widely used in electric vehicles, electric toys, digital products and other electronic products to generate electric power. In the process of charging or discharging, the remaining capacity of a battery respectively increases or decreases. People's daily lives may be affected by an inaccurate display of the remaining capacity of the battery. For example, an electric bicycle may unexpectedly lack sufficient electric power when it is running. Therefore, it is necessary to more accurately calculate the remaining capacity of a battery.

Some conventional methods for calculating the remaining capacity of a battery include detecting an open circuit voltage at both terminals of the battery, and then acquiring the remaining capacity corresponding to the open circuit voltage from a lookup table. However, this method is only applied to the battery in a non-charging or non-discharging state, because the open circuit voltage of the battery cannot be accurately determined in a charging or discharging state. Accordingly, the remaining capacity of the battery cannot be accurately determined.

Other conventional methods for calculating the remaining capacity of a battery include, after detecting the open circuit voltage, calculating charges flowing into or out of the battery using a coulometer during a charging or discharging period. Accordingly, the remaining capacity of the battery can be determined during a charging or discharging period. However, some systems (e.g., low power consumption systems) are used only a few times in a day, and those times are also very short in length, usually milliseconds or seconds. Under these conditions, a coulometer is not accurate enough. Therefore, it is not possible to accurately calculate power consumption of these systems in a non-working state, and so the remaining capacity of the battery cannot be accurately determined using this type of method.

Furthermore, conventional calculations of remaining capacity are focused on rechargeable batteries, such as lithium batteries. A large-capacity dry cell is often used in systems that are inconvenient to charge or take a long time to charge. There is no suitable method for accurately calculating the remaining capacity of a dry cell, and so it is not possible to accurately know the remaining capacity of systems using dry cells.

SUMMARY

Embodiments in accordance with the present invention provide methods and systems for calculating the remaining capacity of a battery.

In embodiments, a method for calculating remaining capacity of a battery in a system including a battery pack, a battery monitor and a processor, the method includes: recording a sleep time of the battery monitor in a sleep mode, reading an open circuit voltage measured and stored in the sleep mode when said sleep time is greater than a preset time period, and determining a first remaining capacity ratio based on the open circuit voltage; calculating charges consumed based on a preset current and the sleep time, and calculating a second remaining capacity ratio based on the charges consumed, a stored first remaining capacity value and a preset total capacity, where the preset current is an average value calculated from multiple measurements of the charges consumed by the battery monitor in the sleep mode; reading values of battery parameters, and determining a third remaining capacity ratio based on the values of battery parameters, where the values of battery parameters are determined by the battery monitor monitoring the battery pack after switching from the sleep mode to a full power mode; determining a current remaining capacity ratio based on the first remaining capacity ratio, the second remaining capacity ratio and the third remaining capacity ratio.

In embodiments, a system for calculating a remaining capacity of a battery, where the system includes a battery pack, operable for supplying electric power for the system; a battery monitor, operable for monitoring values of battery parameters of the battery pack; a processor, where the battery monitor is coupled between the battery pack and the processor. The processor is operable for recording a sleep time of the battery monitor in a sleep mode, for reading an open circuit voltage measured and stored in the sleep mode when the sleep time is greater than a preset time period and for determining a first remaining capacity ratio based on the open circuit voltage; the processor is operable for calculating charges consumed based on a preset current and the sleep time, and for calculating a second remaining capacity ratio based on the charges consumed, a stored first remaining capacity value and a preset total capacity; the processor is operable for reading the values of the battery parameters, and determining a third remaining capacity ratio based on the values of the battery parameters, where the values of the battery parameters are determined by the battery monitor monitoring the battery pack after switching from the sleep mode to a full power mode; the processor is operable for determining a current remaining capacity ratio based on the first remaining capacity ratio, the second remaining capacity ratio and the third remaining capacity ratio.

BRIEF DESCRIPTION OF THE DRAWINGS

Features and advantages of embodiments of the present invention will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in combination with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "calculating," "recording," "reading," "acquiring," "selecting," "determining," or the like, refer to actions and processes of a computing system or similar electronic computing device or processor. A computing system or similar electronic computing device manipulates and transforms data represented as physical (electronic) quantities within the computing system memories, registers or other such information storage, transmission or display devices.

Figure 1:
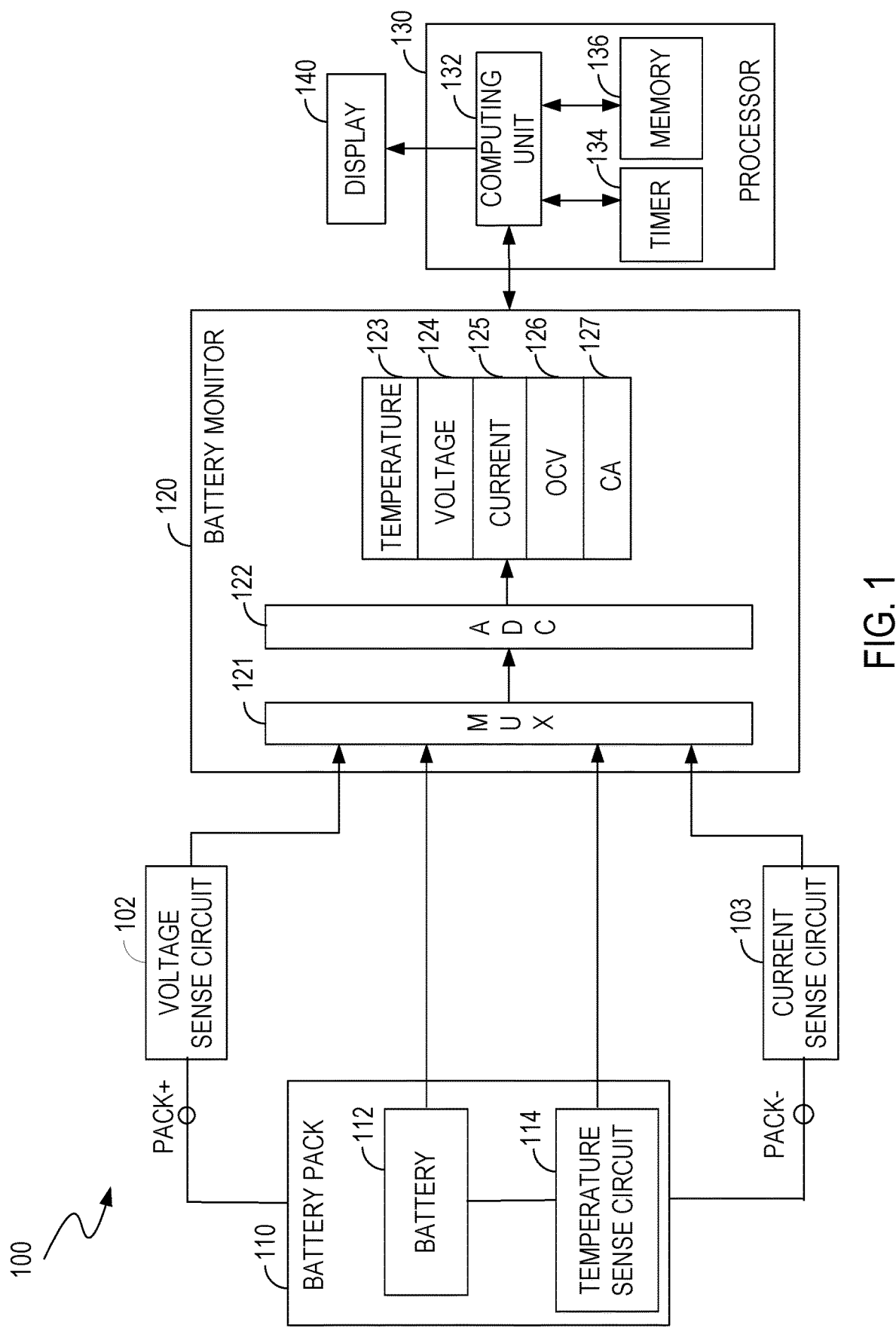
FIG. 1 shows a diagram illustrating a system for calculating a remaining capacity of a battery, in accordance with embodiments of the present invention.

FIG. 1 shows a diagram illustrating a system 100 for calculating the remaining capacity of a battery 112, in accordance with an embodiment of the present invention. The system 100 includes a battery pack 110, a battery monitor 120 and a processor 130. The battery monitor 120 is coupled between the battery pack 110 and the processor 130. The battery pack 110 is operable for supplying electric power for the system 100. The battery pack 110 includes the battery 112 and a temperature sense circuit 114. The battery 112 is coupled to the temperature sense circuit 114. The temperature sense circuit 114 is operable for detecting a battery temperature $T_{BAT}$ of the battery 112.

The battery 112 includes multiple cells coupled in series. Cells can be rechargeable cells or dry cells. Specifically, dry cells can be, but are not limited to, zinc-manganese dry cells, alkaline zinc-manganese dry cells, magnesium-manganese dry cells, zinc-air cells, zinc-mercury oxide cells, zinc-silver oxide cells, and lithium-manganese cells. In an embodiment, a rated capacity of a dry cell is between 10,000 milliamp-hour (mAh) to 20,000 mAh or more.

The battery pack 110 may include a protection circuit (not shown in FIG. 1). The protection circuit is coupled to the battery 112. The protection circuit is operable for avoiding over-discharge or over-current occurred in the battery 112 to extend the lifespan of the battery 112.

In an embodiment, the system 100 includes a voltage sense circuit 102 and a current sense circuit 103. The voltage sense circuit 102 is coupled between the battery pack 110 and the battery monitor 120. The current sense circuit 103 is coupled between the battery pack 110 and the battery monitor 120. The voltage sense circuit 102 and the current sense circuit 103 are used as peripheral circuits of the battery monitor 120. The voltage sense circuit 102 is operable for detecting an open-circuit voltage $V_{OCV}$ at both terminals of the battery 112 under an open circuit condition, and is also operable for detecting a battery voltage $V_{BAT}$ of the battery 112 when the battery 112 is being charged or discharged. The current sense circuit 103 is operable for detecting a battery current $I_{BAT}$ of the battery 112. The battery monitor 120 and its peripheral circuits can either be packaged within the battery pack 110 or placed in a host terminal together with the processor 130.

In an embodiment, the battery monitor 120 includes a multiplexer (MUX) 121, an analog-to-digital converter (ADC) 122, a temperature register 123, a voltage register 124, a current register 125, an open circuit voltage (OCV) register 126 and a current accumulation (CA) register 127. The MUX 121 selectively transmits information indicating values of battery parameters to the ADC 122. The battery parameters include the battery voltage $V_{BAT}$, the battery current $I_{BAT}$, the battery temperature $T_{BAT}$ and the open circuit voltage $V_{OCV}$. The ADC 122 receives the information, converts it to a digital form and transmits it to the registers, which store the information in digital form.

Specifically, the temperature register 123 is operable for storing the battery temperature $T_{BAT}$. The voltage register 124 is operable for storing the battery voltage $V_{BAT}$. The current register 125 is operable for storing the battery current $I_{BAT}$. The OCV register 126 is operable for storing the open circuit voltage $V_{OCV}$ at both terminals of the battery 112. The CA register 127 is operable for storing a calculated remaining capacity value.

In an embodiment, the processor 130 includes a computing unit 132, a timer 134 and a memory 136. The processor 130 can access the battery monitor 120 using the I2C (inter-integrated circuit) protocol. In other embodiments, the battery monitor 120 and the processor 130 communicate in other ways. The timer 134 is operable for recording the amount of time the battery monitor 120 is in a sleep mode. The timer 134 is also operable for recording the amount of time the battery monitor 120 is in the full power mode. The memory 136 is operable for storing information including, but not limited to, a remaining capacity ratio RSOC that is calculated and selected by the processor 130, an OCV lookup table, an input threshold voltage (VIT) lookup table, a preset current, and a preset total capacity. The computing unit 132 is operable for reading the values of the battery parameters stored by the battery monitor 120, and for calculating and selecting the remaining capacity value and the remaining capacity ratio RSOC of the system 100 based on the data of the timer 134 and the memory 136.

The OCV lookup table lists remaining capacity ratios corresponding to different open circuit voltages of the battery 112. For example, the OCV lookup table includes: a remaining capacity ratio $RSOC_1$ corresponding to an open circuit voltage $V_{OCV}$, a remaining capacity ratio $RSOC_2$ corresponding to an open circuit voltage $V_{OCV2}$, ..., a remaining capacity ratio $RSOC_n$ corresponding to an open circuit voltage $V_{OCVn}$.

The VIT lookup table lists remaining capacity ratios corresponding to different battery voltages $V_{BAT}$, different battery currents $I_{BAT}$ and different battery temperatures $T_{BAT}$ of the battery 112. The VIT lookup table includes: a remaining capacity ratio $RSOC_1'$ corresponding to a battery voltage $V_{BAT1}$, a battery current $I_{BAT1}$ and a battery temperature $T_{BAT1}$; a remaining capacity ratio $RSOC_2'$ corresponding to a battery voltage $V_{BAT2}$, a battery current $I_{BAT2}$ and a battery temperature $T_{BAT2}$; ...; a remaining capacity ratio $RSOC_n'$ corresponding to a battery voltage $V_{BATn}$, a battery current $I_{BATn}$ and a battery temperature $T_{BATn}$.

The preset current value is an average value calculated from multiple measurements of the charges consumed by the battery monitor 120 in the sleep mode. The preset total capacity is a rated total capacity of the battery 112.

The system 100 also includes a display 140. The display 140 can display the remaining capacity ratio and the remaining capacity value calculated and selected by the processor 130, as will be described further below.

The system 100 can be used in charging scenarios such as shared bicycles and base stations. Shared bicycles refer to a bicycle sharing service provided by enterprises in campuses, subway stations, bus stations, residential areas, commercial areas, public service areas, etc. It is a time-sharing rental mode. A user can unlock the shared bicycle by scanning a Quick Respond Code on the shared bicycle through a mobile terminal. The working principle of an electronic lock system is as follows: a host terminal acquires and verifies the device code corresponding to the electronic lock system and the identity of the mobile terminal. After verification, the host terminal sends unlock signals directly or indirectly to the electronic lock system. The electronic lock system receives and executes the unlock signals to complete the unlock. Thus, electronic locks on shared bicycles need to communicate directly or indirectly with the host terminal to send or receive information.

If the remaining capacity of the battery 112 is not monitored accurately, the remaining capacity can be exhausted before an alarm signal is sent to the host terminal. As a result, the communication between the electronic lock system and the host terminal will be disconnected, the electronic lock system cannot be locked or unlocked, and the host terminal also cannot acquire location information for the shared bicycle. Therefore, the accuracy of the remaining capacity is crucial. However, a conventional system for calculating the remaining capacity of the battery 112 can monitor the remaining capacity of the battery 112 only when the electronic lock system is in the full power mode (e.g., unlocked, positioned or periodically awakened). Shared bicycles are used only a limited number of times in a day, and so they will be in a sleep mode for large parts of the day. In addition, when a conventional system is in a sleep mode, the power consumption of the system is very low, generally at the level of micro-amperes, and because a conventional battery monitor cannot detect that level of power consumption, accumulative power consumption over a relatively long time will lead to an inaccurate calculation of the remaining capacity of the battery 112.

In contrast, the system 100 according to the present invention calculates accurately the remaining capacity of the battery 112 by subtracting the charges consumed in the sleep mode. On the one hand, it ensures that the electronic lock system can send an alarm signal to the host terminal when the remaining capacity is lower than a preset threshold, allowing the time for the enterprise to charge or replace the battery 112, thus saving maintenance costs. On the other hand, users can safely adjust the operation of the shared bicycle based on accurate knowledge of the remaining battery capacity.

Figure 2:
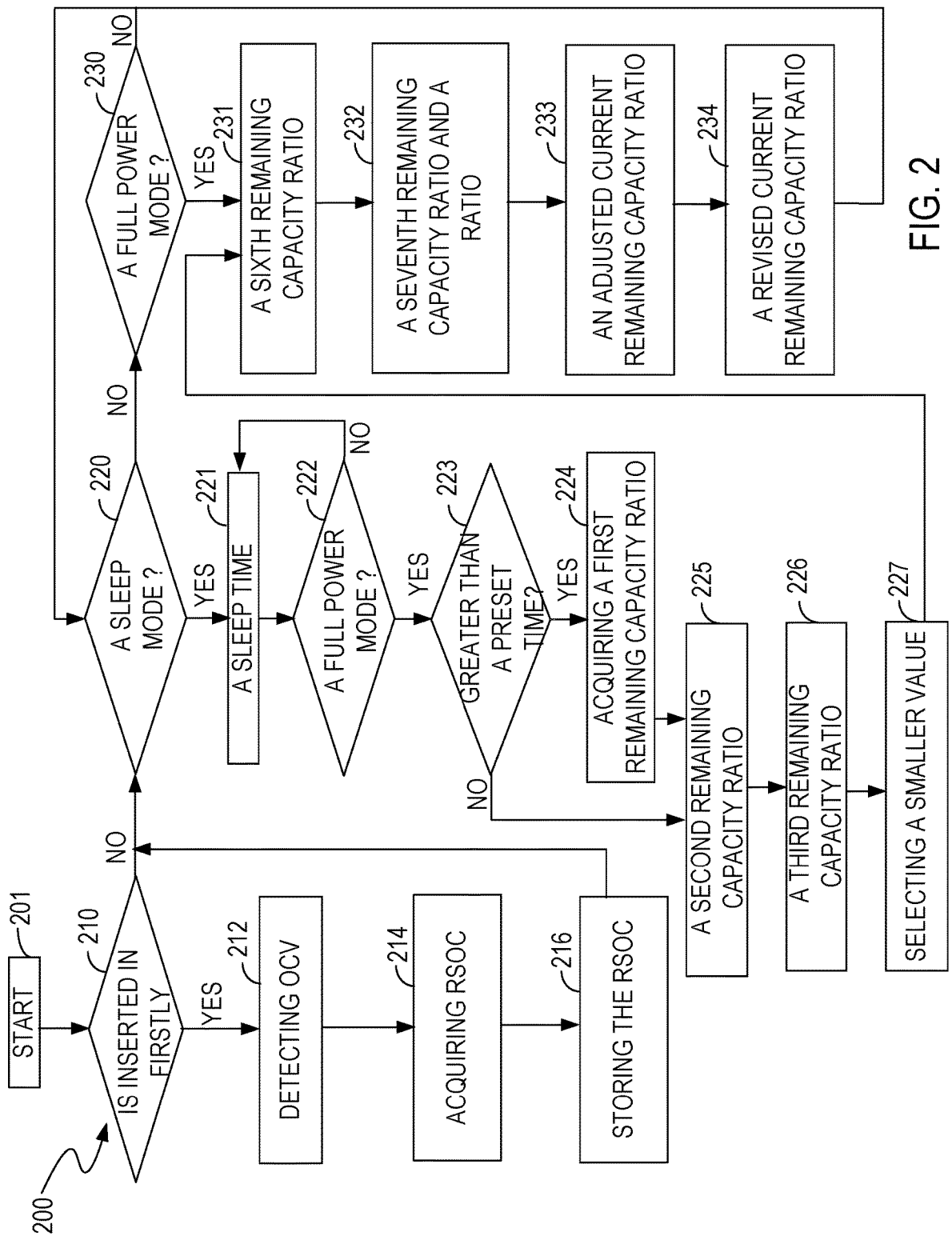
FIG. 2 shows a flowchart of a method for calculating a remaining capacity of a battery, in accordance with embodiments of the present invention.

FIG. 2 shows a flowchart 200 of a method for calculating the remaining capacity of a battery, in accordance with embodiments of the present invention. FIG. 2 is described in conjunction with FIG. 1. Although specific steps are disclosed in FIG. 2, these steps are only examples. That is, the present invention is well suited to performing various other steps or variations of the steps recited in FIG. 2.

In step 201, the system 100 is started.

In an embodiment, in step 210, when the battery 112 is installed in the system 100, an identifying signal stored in the battery monitor 120 is automatically set to the number "1", and the system starts to initialize. After initialization, the processor 130 sets the identifying signal to the number "0". Thereafter, if the battery 112 is continuously disposed in the system 100, then the identifying signal is maintained at the number "0". That is, when the identifying signal is the number "1", the battery 112 is installed in the system 100 for the first time, and so step 210 goes to step 212. When the identifying signal is the number "0", the battery 112 is not being installed for the first time in the system 100, and so step 210 goes to step 220. In other embodiments, other ways can be used to indicate whether the battery 112 is being installed in the system 100 for the first time.

In an embodiment, in step 212, the voltage sense circuit 102 detects the open voltage $V_{OCV}$ at both terminals of the battery 112, and transmits the open circuit voltage $V_{OCV}$ to the battery monitor 120. In an embodiment, in step 214, the battery monitor 120 receives the open circuit voltage $V_{OCV}$ and stores it in the OCV register 126. The processor 130 reads the open circuit voltage $V_{OCV}$, and acquires a remaining capacity ratio RSOC from the OCV lookup table stored in the memory 136. The remaining capacity ratio RSOC is the current remaining capacity ratio of the system 100 after startup. In an embodiment, in step 216, the computing unit 132 calculates the current remaining capacity value according to the current remaining capacity ratio and a preset total capacity, and stores it in the CA register 127 as a current remaining capacity value after the system 100 is started. The memory 136 can store the current remaining capacity ratio. The current remaining capacity ratio and the current remaining capacity value can be used as an initial remaining capacity ratio and an initial remaining capacity value, respectively. In addition, the display 140 can also display the current remaining capacity ratio and the current remaining capacity value. If the current remaining capacity ratio is lower than a reference value, then an alarm signal can be sounded or displayed by the system 100 to remind a user to replace the battery 112 or charge the battery 112. The reference value can be specified by design and/or set by a user. Then, step 216 goes to step 220.

In an embodiment, in step 220, a determination is made with regard to whether the battery monitor 120 is switched to the sleep mode. When the processor 130 determines that the battery monitor 120 has been switched to the sleep mode, step 220 goes to step 221. Otherwise, step 220 goes to step 230.

In an embodiment, in step 221, the timer 134 records a time t1 when the battery monitor 120 is switched to the sleep mode. Starting at time t1, the amount of time that the battery monitor 120 is in the sleep mode (sleep time) is measured and recorded. In other embodiments, other ways can be used to measure and record the sleep time. In the sleep mode, when the sleep time is greater than a preset time period, the voltage sense circuit 102 detects the open circuit voltage $V_{OCV}$ at both terminals of the battery 112 automatically, and the OCV register 126 of the battery monitor 120 stores the open circuit voltage $V_{OCV}$. In an embodiment, the OCV register 126 erases the last previously stored open circuit voltage $V_{OCV}$ while storing the most recent open circuit voltage $V_{OCV}$.

More specifically, in an embodiment, in step 222, when the processor 130 determines that the battery monitor 120 is switched from the sleep mode to the full power mode, the timer 134 records a time t2 when the battery monitor 120 is switched to the full power mode. Then, the computing unit 132 calculates the difference between the time t2 and the time t1, and the difference is used as the sleep time t2−t1 of the battery monitor 120. In other embodiments, other ways can be used to determine the sleep time. When the battery monitor 120 remains in the sleep mode (that is, it does not enter the full power mode), then the timer 134 continues to measure and record the sleep time continuing from time t1 in step 221.

In an embodiment, in step 223, the processor 130 determines whether the sleep time is greater than the preset time period. Specifically, when the sleep time t2−t1 is greater than the preset time period, step 223 goes to step 224. When the sleep time t2−t1 is not greater than the preset time period, step 223 goes to step 225. In an embodiment, the preset time period is 30 minutes.

In an embodiment, in step 224, the processor 130 reads the open circuit voltage $V_{OCV}$ that was stored in step 221, and acquires a first remaining capacity ratio from the OCV lookup table.

In an embodiment, in step 225, the processor 130 reads a preset current value. In an embodiment, the preset current value is an average current value calculated from multiple prior measurements of the charges consumed by the battery monitor 120 in the sleep mode. The charges consumed are calculated in the sleep mode by multiplying the preset current value and the sleep time t2−t1. Then, the processor 130 reads a preset total capacity and a first remaining capacity value, and subtracts the charges consumed from the first remaining capacity value to determine an available remaining capacity value. The preset total capacity can be the rated capacity of the battery 112. The first remaining capacity value is the current remaining capacity value stored in the CA register 127 before entering the sleep mode. The ratio of the available remaining capacity value to the preset total capacity is referred to herein as a second remaining capacity ratio. Thus, by subtracting the power consumption of the system 100 in the sleep mode, the second remaining capacity ratio is closer to the true remaining capacity ratio of the battery 112.

In an embodiment, in step 226, after switching to the full power mode, the voltage sense circuit 102 detects the battery voltage $V_{BAT}$ of the battery 112, the current sense circuit 103 detects the battery current $I_{BAT}$ of the battery 112, and the temperature sense circuit 114 detects the battery temperature $T_{BAT}$ of the battery 112. The battery monitor 120 stores the battery voltage $V_{BAT}$, the battery current $I_{BAT}$ and the battery temperature $T_{BAT}$. The processor 130 reads the battery voltage $V_{BAT}$, the battery current $I_{BAT}$ and the battery temperature $T_{BAT}$ and acquires a third remaining capacity ratio from the VIT lookup table according to the battery voltage $V_{BAT}$, the battery current $I_{BAT}$ and the battery temperature $T_{BAT}$. In this embodiment, the third remaining capacity ratio can accurately reflect the remaining capacity ratio RSOC of the system 100 in its current operating condition.

In another embodiment, step 226 further includes: the processor 130 reads a discharge cut-off voltage $V_{EOD}$, and acquires a fourth remaining capacity ratio from the VIT lookup table according to the values of the discharge cut-off voltage $V_{EOD}$, the battery current $I_{BAT}$ and the battery temperature $T_{BAT}$. The processor 130 calculates the difference between the third remaining capacity ratio and the fourth remaining capacity ratio to determine a fifth remaining capacity ratio. Compared with the third remaining capacity ratio, the fifth remaining capacity ratio is an actual available remaining capacity ratio of the system 100, which can better reflect the actual remaining capacity of the system 100. The fifth remaining capacity ratio can be 100% when the battery 112 reaches a full charge condition, and the fifth remaining capacity ratio can be 0% when the battery 112 reaches a cut-off discharge condition.

In an embodiment, if the sleep time is greater than the preset time period, then step 227 includes: the processor 130 selects the minimum of the first remaining capacity ratio, the second remaining capacity ratio and the third remaining capacity ratio as the current remaining capacity ratio of the system 100 after switching to the full power mode. In other embodiments, other ways can be used to determine the current remaining capacity ratio. For example, the current remaining capacity ratio can be determined by calculating an average value of the first remaining capacity ratio, the second remaining capacity ratio and the third remaining capacity ratio. In an embodiment, by selecting the minimum or average of the first, second, and third remaining capacity ratios, a user will have enough time to adjust the operation of the battery 112. As a result, unexpected loss of power can be avoided, thereby preventing inconvenience to the user.

In this embodiment, if the sleep time is not greater than the preset time period, then the voltage sense circuit 102 does not detect the open circuit voltage $V_{OCV}$ of the battery 112 and so cannot acquire the first remaining capacity ratio from the OCV lookup table. If that is the case, then step 227 also includes: the processor 130 selects the smaller value of the second remaining capacity ratio and the third remaining capacity ratio as the current remaining capacity ratio of the system 100 after switching to the full power mode. In other embodiments, other ways can be used to determine the current remaining capacity ratio. For example, an average of the second remaining capacity ratio and the third remaining capacity ratio is determined and used as the current remaining capacity ratio. Thus, in this embodiment, by selecting the smaller or average of the second and third remaining capacity ratios, a user will have enough time to adjust the operation of the battery 112. As a result, unexpected loss of power is avoided, thereby preventing inconvenience to the user.

In another embodiment, if the sleep time is greater than the preset time period, then step 227 includes: the processor 130 selects the minimum of the first remaining capacity ratio, the second remaining capacity ratio and the fifth remaining capacity ratio as a revised current remaining capacity ratio of the system 100 after switching to the full power mode. In other embodiments, other ways can be used to determine the current remaining capacity ratio. For example, an average of the first remaining capacity ratio, the second remaining capacity ratio and the fifth remaining capacity ratio is determined and used as the current remaining capacity ratio. In this embodiment, the first remaining capacity ratio, the second remaining capacity ratio and the fifth remaining capacity ratio are all close to the real remaining capacity ratio. Thus, by selecting the minimum or average of the first remaining capacity ratio, the second remaining capacity ratio and the fifth remaining capacity ratio, a user will have enough time to adjust operation of the battery 112. As a result, unexpected loss of power is avoided, thereby preventing inconvenience to the user.

In this embodiment, if the sleep time is not greater than the preset time period, then the voltage sense circuit 102 does not detect the open circuit voltage $V_{OCV}$ of the battery 112 and so cannot acquire the first remaining capacity ratio from the OCV lookup table. If that is the case, then step 227 includes: the processor 130 selects the smaller of the second remaining capacity ratio and the fifth remaining capacity ratio as a revised current remaining capacity ratio of the system 100 after switching to the full power mode. In other embodiments, other ways can be used to determine the revised current remaining capacity ratio. For example, an average of the second remaining capacity ratio and the fifth remaining capacity ratio is determined and used as the current remaining capacity ratio. Thus, by selecting the smaller or average of the second remaining capacity ratio and the fifth remaining capacity ratio, a user will have enough time to adjust operation of the battery 112. As a result, unexpected loss of power is avoided, thereby preventing inconvenience to the user.

In addition, the computing unit 132 also calculates a current remaining capacity value corresponding to the current remaining capacity ratio, or calculates a current remaining capacity value corresponding to the revised current remaining capacity ratio. The current remaining capacity value corresponding to the current remaining capacity ratio or the current remaining capacity value corresponding to the current remaining capacity ratio is stored in the CA register 127 and used as an updated current remaining capacity value. The CA register 127 erases the last previously stored current remaining capacity value while storing the updated current remaining capacity value. The display 140 displays the current remaining capacity ratio and the current remaining capacity value, or the display 140 displays the revised current remaining capacity ratio and the current remaining capacity value corresponding to the revised current remaining capacity ratio. When the current remaining capacity ratio or the revised current remaining capacity ratio is lower than a reference value, an alarm signal can be sounded or displayed by the system 100 to remind the user to replace or charge the battery 112. The reference value can be specified by design and/or set by a user.

After step 227, flowchart 200 goes to step 231.

In an embodiment, in step 230, the processor 130 determines whether the battery monitor 120 is switched from the sleep mode to the full power mode. When the battery monitor 120 is switched to the full power mode, step 230 goes to step 231. When the battery monitor 120 is not switched to the full power mode, step 230 returns to step 220.

In an embodiment, in step 231, the timer 134 measures and records the amount of time since the battery monitor 120 entered the full power mode. When the amount of time is greater than a preset time interval, the processor 130 reads the values of the battery parameters and determines a sixth remaining capacity ratio from the VIT lookup table according to the values of the battery voltage $V_{BAT}$, the battery current $I_{BAT}$, and the battery temperature $T_{BAT}$ read when the preset time interval is exceeded. The preset time interval can be set specified by design and/or set by a user.

In an embodiment, in step 232, the processor 130 acquires a seventh remaining capacity ratio from the VIT lookup table according to the stored discharge cut-off voltage $V_{EOD}$, the battery current $I_{BAT}$ read when the preset time interval is exceeded and the battery temperature $T_{BAT}$ read when the preset time interval is exceeded, and calculates the difference between the sixth remaining capacity ratio and the seventh remaining capacity ratio. Then, the processor 130 reads the current remaining capacity ratio or the revised current remaining capacity ratio as described above, and calculates the ratio of the difference between the sixth and seventh remaining capacity ratios to the current remaining capacity ratio or to the revised current remaining capacity ratio.

In an embodiment, in step 233, by multiplying the ratio calculated by the processor 130 in step 232, the value of the battery current $I_{BAT}$ read when the preset time interval is exceeded and the preset time interval, a variation value can be determined. Then, by adding or subtracting the variation value to/from the stored current remaining capacity value, the adjusted current remaining capacity value can be determined. The CA register 127 erases the last previously stored current remaining capacity value while storing the adjusted current remaining capacity value.

In an embodiment, in step 234, the ratio of the adjusted current remaining capacity value to the preset total capacity is calculated, to determine a revised current remaining capacity ratio of the system 100 in the full power mode. This method of revising the remaining capacity ratio can make the change in the remaining capacity ratio relatively continuous, to avoid a relatively large jump in that ratio (e.g., to avoid a jump directly from 50% to 30%).

In addition, The display 140 can display the revised current remaining capacity ratio and the adjusted current remaining capacity value. When the revised current remaining capacity ratio is lower than a reference value, an alarm signal can be sounded or displayed by the system 100 to remind a user to replace or charge the battery 112. Then, step 234 returns to step 220.

Figure 3:
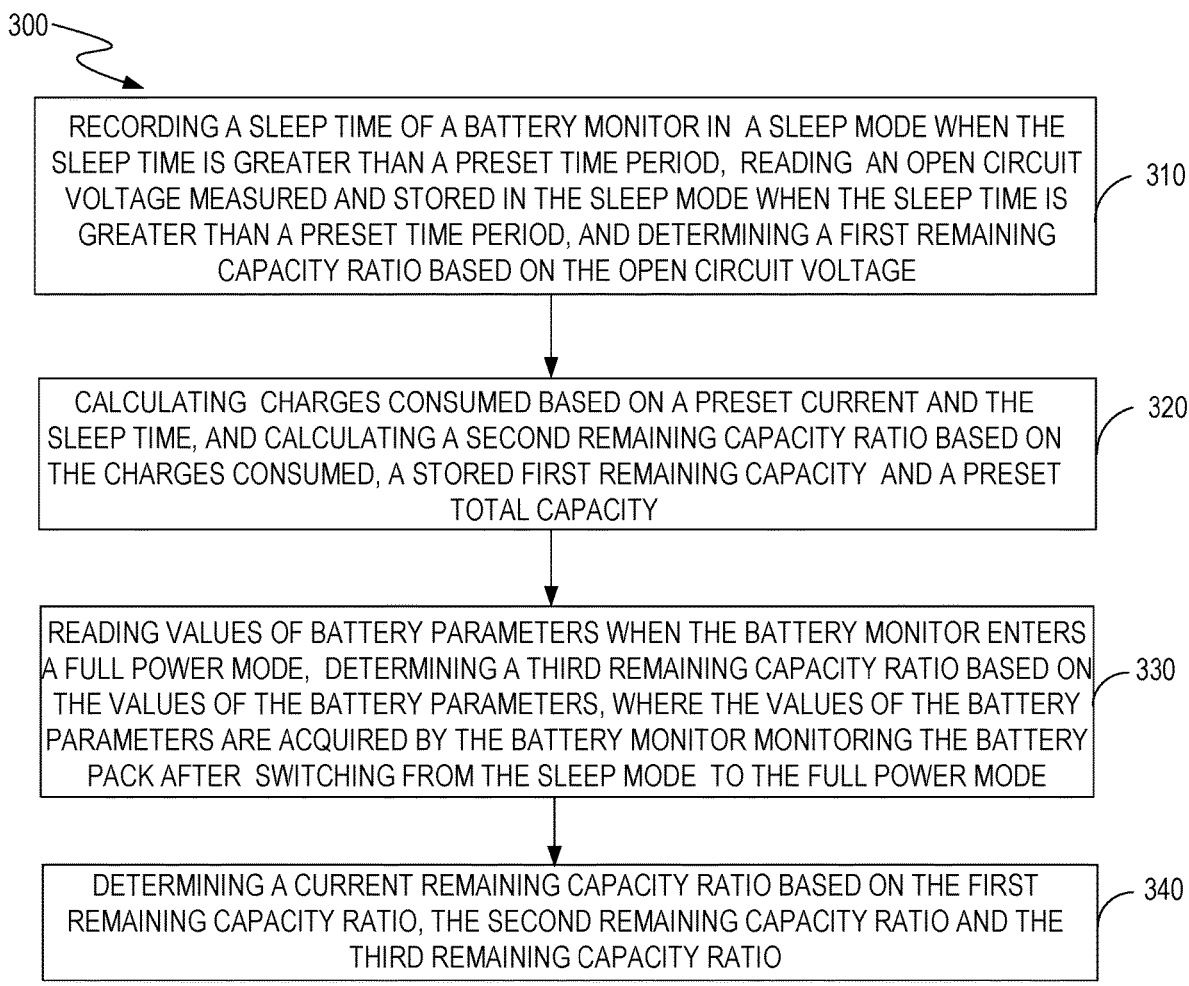
FIG. 3 shows a flowchart of a method for calculating a remaining capacity of a battery, in accordance with embodiments of the present invention.

FIG. 3 shows a flowchart 300 of a method for calculating the remaining capacity of a battery 112, in accordance with embodiments of the present invention. FIG. 3 is described in conjunction with FIG. 1.

In an embodiment, in step 310, a sleep time of the battery monitor 120 is recorded in a sleep mode, an open circuit voltage $V_{OCV}$ measured and stored in the sleep mode is read when the sleep time is greater than a preset time period, and a first remaining capacity ratio is determined based on the open circuit voltage $V_{OCV}$.

In an embodiment, in step 320, charges consumed are calculated based on a preset current and the sleep time, and a second remaining capacity ratio is calculated based on the charges consumed, a stored first remaining capacity value, and a preset total capacity, where the preset current is an average calculated from multiple measurements of the charges consumed by the battery monitor 120 in the sleep mode.

In an embodiment, in step 330, values of the battery parameters are read and a third remaining capacity ratio is determined based on the values of the battery parameters, where the values of the battery parameters are determined by the battery monitor 120 monitoring the battery pack 110 after switching from the sleep mode to the full power mode.

In an embodiment, in step 340, a current remaining capacity ratio is determined based on the first remaining capacity ratio, the second remaining capacity ratio and the third remaining capacity ratio.

Figure 4:
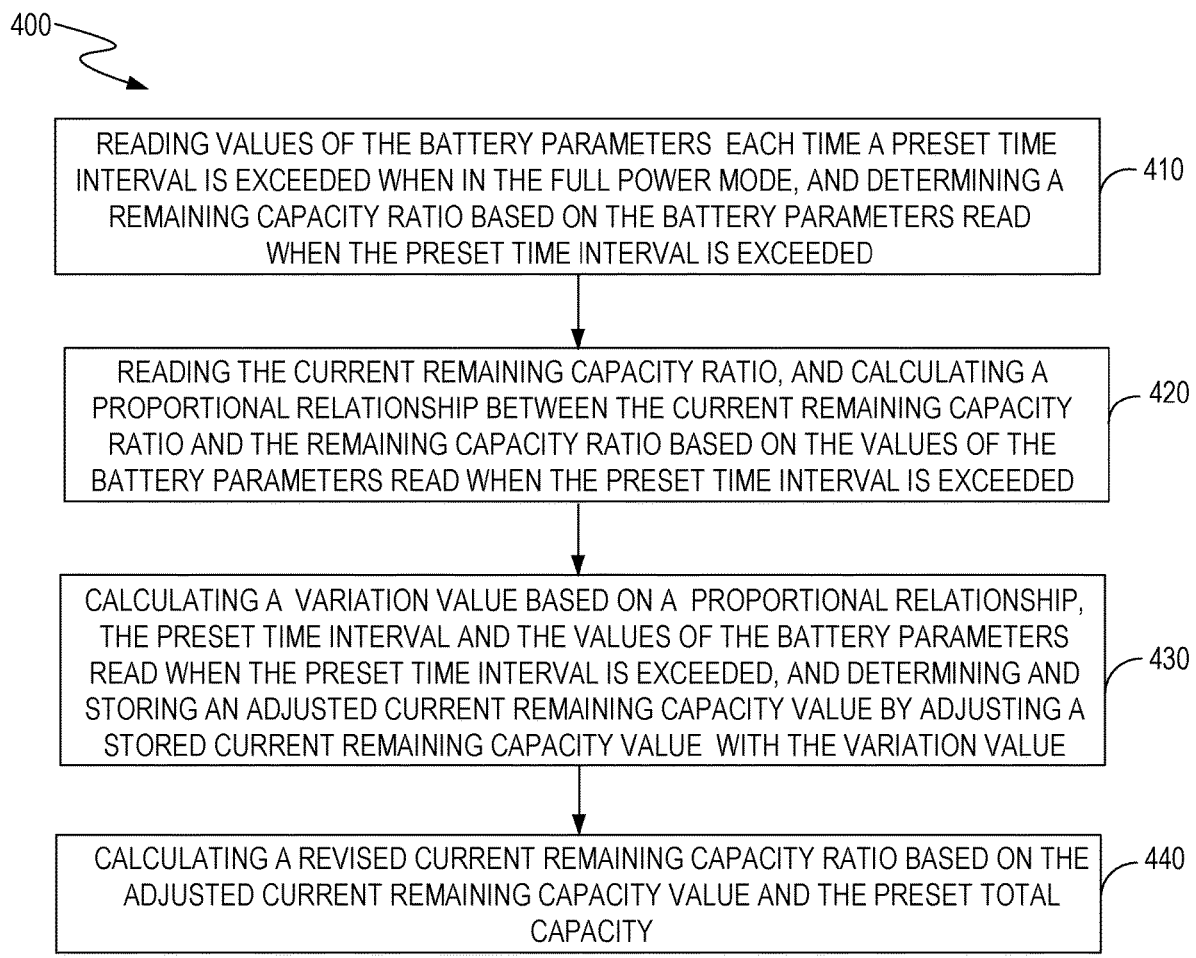
FIG. 4 shows a flowchart of a method for calculating a remaining capacity of a battery, in accordance with embodiments of the present invention.

FIG. 4 shows a flowchart 400 of a method for calculating the remaining capacity of a battery 112, in accordance with embodiments of the present invention. FIG. 4 is described in conjunction with FIG. 1.

In an embodiment, in step 410, the timer 134 measures and records an amount of time since the battery monitor 120 entered the full power mode. When the amount of time is greater than a preset time interval, the processor 130 reads the values of the battery parameters and determines the sixth remaining capacity ratio from a VIT lookup table according to the values of the battery parameters read when the preset time interval is exceeded. In this embodiment, the sixth remaining capacity ratio can accurately reflect a remaining capacity ratio of the system 100.

In an embodiment, in step 420, the processor 130 reads the current remaining capacity ratio or the revised current remaining capacity ratio and calculates the ratio of the sixth remaining capacity ratio to the current remaining capacity ratio or the revised current remaining capacity ratio.

In an embodiment, in step 430, by multiplying the ratio calculated by the processor 130 in step 420, the preset time interval and the value of the battery current $I_{BAT}$ read when the preset time interval is exceeded, a variation value can be determined. By adding or subtracting the variation value to/from the stored current remaining capacity value, the adjusted current remaining capacity value is determined. The CA register 127 erases the last previously stored current remaining value while storing the adjusted current remaining capacity value.

In an embodiment, in step 440, a revised current remaining capacity ratio is determined by calculating the ratio of the adjusted current remaining capacity value to a preset total capacity. This method of revising the remaining capacity ratio can make the change in the remaining capacity ratio relatively continuous, to avoid a relatively large jump in that ratio (e.g., to avoid a jump directly from 50% to 30%).

In addition, The display 140 displays the revised current remaining capacity ratio and the adjusted current remaining capacity value. At the end of step 440, step 440 returns to step 410. If the system 100 in the full power mode without entering a sleep mode, then the method 400 loops between step 410 and step 440.

As described above, methods and systems for calculating a remaining capacity of a battery are disclosed. The present invention can calculate charges consumed by a battery monitor in a sleep mode. When the battery monitor switches from the sleep mode to a full power mode, an accurate remaining capacity ratio is calculated by subtracting the charges consumed in the sleep mode. A more accurate current remaining capacity ratio is calculated by selecting among the remaining capacity ratio, a remaining capacity ratio determined by the open circuit voltage $V_{OCV}$ and a remaining capacity ratio determined by the values of the battery parameters. Thus, disconnection of communication between the host terminal and the electronic lock system can be avoided, thus saving maintenance costs.

While the foregoing description and drawings represent embodiments of the present invention, it will be understood that various additions, modifications, and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A method for calculating a remaining capacity of a battery in a system comprising a battery pack, a battery monitor and a processor, said method comprising:
   recording a sleep time of said battery monitor in a sleep mode, reading an open circuit voltage measured and stored in said sleep mode when said sleep time is greater than a preset time period, and determining a first remaining capacity ratio based on said open circuit voltage;
   calculating charges consumed based on a preset current and said sleep time, and calculating a second remaining capacity ratio based on said charges consumed, a stored first remaining capacity value, and a preset total capacity, wherein said preset current is an average value calculated from multiple measurements of charges consumed by said battery monitor in said sleep mode;
   reading values of battery parameters when said battery monitor enters a full power mode, and determining a third remaining capacity ratio based on said values of said battery parameters, wherein said values of said battery parameters are determined by said battery monitor monitoring said battery pack after switching from said sleep mode to said full power mode;
   determining a current remaining capacity ratio based on said first remaining capacity ratio, said second remaining capacity ratio and said third remaining capacity ratio;
   reading a stored discharge cut-off voltage, determining a fourth remaining capacity ratio based on said discharge cut-off voltage and said values of said battery parameters, and determining a fifth remaining capacity ratio based on a difference between said third remaining capacity ratio and said fourth remaining capacity ratio; and
   determining a revised current remaining capacity ratio based on said first remaining capacity ratio, said second remaining capacity ratio and said fifth remaining capacity ratio.

2. The method of claim 1, wherein said determining a revised current remaining capacity ratio based on said first remaining capacity ratio, said second remaining capacity ratio and said fifth remaining capacity ratio comprises: selecting a minimum of said first remaining capacity ratio, said second remaining capacity ratio and said fifth remaining capacity ratio as said revised current remaining capacity ratio.

3. The method of claim 1, further comprising:
   determining said revised current remaining capacity ratio based on said second remaining capacity ratio and said fifth remaining capacity ratio, when said sleep time is not greater than said preset time period.

4. The method of claim 3, wherein said determining said revised current remaining capacity ratio based on said second remaining capacity ratio and said fifth remaining capacity ratio further comprises: selecting a smaller value of said second remaining capacity ratio and said fifth remaining capacity ratio as said revised current remaining capacity ratio.

5. A system for calculating a remaining capacity of a battery, said system comprising:
   a battery pack, operable for supplying electric power for said system;

a battery monitor, operable for monitoring values of battery parameters of said battery pack; and a processor, wherein said battery monitor is coupled between said battery pack and said processor, wherein said processor is operable for recording a sleep time of said battery monitor in a sleep mode, reading an open circuit voltage measured and stored in said sleep mode when said sleep time is greater than a preset time period and determining a first remaining capacity ratio based on said open circuit voltage; operable for calculating charges consumed based on a preset current and said sleep time, and calculating a second remaining capacity ratio based on said charges consumed, a stored first remaining capacity value and a preset total capacity, wherein said preset current is an average value calculated from multiple measurements of charge consumed by said battery monitor in said sleep mode; operable for reading said values of said battery parameters, and determining a third remaining capacity ratio based on said values of said battery parameters, wherein said values of said battery parameters are determined by said battery monitor monitoring said battery pack after switching from said sleep mode to a full power mode; operable for determining a current remaining capacity ratio based on said first remaining capacity ratio, said second remaining capacity ratio and said third remaining capacity ratio, wherein said processor is further operable for determining said current remaining capacity ratio based on said second remaining capacity ratio and said third remaining capacity ratio when said sleep time is not greater than said preset time period.

6. The system of claim 5, wherein said processor is further operable for selecting a smaller value of said second remaining capacity ratio and said third remaining capacity ratio as said current remaining capacity ratio.

7. The system of claim 5, wherein said processor is further operable for reading a stored discharge cut-off voltage when said sleep time is not greater than said preset time period, for determining a fourth remaining capacity ratio based on said discharge cut-off voltage and said values of said battery parameters, for determining a fifth remaining capacity ratio based on a difference between said third remaining capacity ratio and said fourth remaining capacity ratio; and for determining a revised current remaining capacity ratio based on said second remaining capacity ratio and said fifth remaining capacity ratio.

8. The system of claim 7, wherein said processor is further operable for selecting a smaller value of said second remaining capacity ratio and said fifth remaining capacity ratio as said revised current remaining capacity ratio.

9. The system of claim 5, wherein said processor is further operable for reading values of said battery parameters each time a preset time interval is exceeded when in said full power mode, and for determining a remaining capacity ratio based on said values of said battery parameters read when said preset time interval is exceeded; for reading said current remaining capacity ratio, and for calculating a proportional relationship between said current remaining capacity ratio and said remaining capacity ratio based on said values of said battery parameters read when said preset time interval is exceeded; for calculating a variation value based on said proportional relationship, said preset time interval and said battery parameters read when said preset time interval is exceeded, for determining and storing an adjusted current remaining capacity value by adjusting a stored current remaining capacity value with said variation value; and for calculating a revised current remaining capacity ratio based on said adjusted current remaining capacity value and said preset total capacity.

10. The system of claim 5, wherein said processor is further operable for reading values of said battery parameters each time a preset time interval is exceeded when in said full power mode, and for determining a remaining capacity ratio based on said values of said battery parameters read when said preset time interval is exceeded; for determining a remaining capacity ratio based on a stored discharge cut-off voltage and said battery parameters read when said preset time interval is exceeded, for calculating a difference between said remaining capacity ratio based on said battery parameters read when said preset time interval is exceeded and said remaining capacity ratio based on said stored discharge cut-off voltage and said values of said battery parameters read when said preset time interval is exceeded, for reading said current remaining capacity ratio, and for calculating a proportional relationship based on said difference and said current remaining capacity ratio; for calculating a variation value based on said proportional relationship, said preset time interval and said values of said battery parameters, for determining and storing an adjusted current remaining capacity value by adjusting a stored current remaining capacity value with said variation value; and for calculating a revised current remaining capacity ratio based on said adjusted current remaining capacity value and said preset total capacity.

11. A method for calculating a remaining capacity of a battery in a system comprising a battery pack, a battery monitor and a processor, said method comprising:

recording a sleep time of said battery monitor in a sleep mode, reading an open circuit voltage measured and stored in said sleep mode when said sleep time is greater than a preset time period, and determining a first remaining capacity ratio based on said open circuit voltage;

calculating charges consumed based on a preset current and said sleep time, and calculating a second remaining capacity ratio based on said charges consumed, a stored first remaining capacity value, and a preset total capacity, wherein said preset current is an average value calculated from multiple measurements of charges consumed by said battery monitor in said sleep mode;

reading values of battery parameters when said battery monitor enters a full power mode, and determining a third remaining capacity ratio based on said values of said battery parameters, wherein said values of said battery parameters are determined by said battery monitor monitoring said battery pack after switching from said sleep mode to said full power mode;

determining a current remaining capacity ratio based on said first remaining capacity ratio, said second remaining capacity ratio and said third remaining capacity ratio;

reading values of said battery parameters each time a preset time interval is exceeded when in said full power mode, and determining a remaining capacity ratio based on said values of said battery parameters read when said preset time interval is exceeded;

reading said current remaining capacity ratio, and calculating a proportional relationship between said current remaining capacity ratio and said remaining capacity ratio based on said values of said battery parameters read when said preset time interval is exceeded;

calculating a variation value based on said proportional relationship, said preset time interval and said values of said battery parameters read when said preset time interval is exceeded, and determining and storing an adjusted current remaining capacity value by adjusting a stored current remaining capacity value with said variation value; and calculating a revised current remaining capacity ratio based on said adjusted current remaining capacity value and said preset total capacity.

12. A method for calculating a remaining capacity of a battery in a system comprising a battery pack, a battery monitor and a processor, said method comprising:

recording a sleep time of said battery monitor in a sleep mode, reading an open circuit voltage measured and stored in said sleep mode when said sleep time is greater than a preset time period, and determining a first remaining capacity ratio based on said open circuit voltage;

calculating charges consumed based on a preset current and said sleep time, and calculating a second remaining capacity ratio based on said charges consumed, a stored first remaining capacity value, and a preset total capacity, wherein said preset current is an average value calculated from multiple measurements of charges consumed by said battery monitor in said sleep mode;

reading values of battery parameters when said battery monitor enters a full power mode, and determining a third remaining capacity ratio based on said values of said battery parameters, wherein said values of said battery parameters are determined by said battery monitor monitoring said battery pack after switching from said sleep mode to said full power mode; and determining a current remaining capacity ratio based on said first remaining capacity ratio, said second remaining capacity ratio and said third remaining capacity ratio;

wherein said determining a current remaining capacity ratio based on said first remaining capacity ratio, said second remaining capacity ratio and said third remaining capacity ratio comprises: selecting a minimum of said first remaining capacity ratio, said second remaining capacity ratio and said third remaining capacity ratio as said current remaining capacity ratio.

* * * * *